US012787421B2

(12) United States Patent
Zhang et al.

(10) Patent No.: US 12,787,421 B2
(45) Date of Patent: Nov. 3, 2026

(54) SEMICONDUCTOR DEVICE WITH LATERAL DIODES AND STACKED FETS

(71) Applicant: INTERNATIONAL BUSINESS MACHINES CORPORATION, Armonk, NY (US)

(72) Inventors: Chen Zhang, Santa Clara, CA (US); Ruilong Xie, Niskayuna, NY (US); Terence B. Hook, Jericho Center, VT (US); Lei Zhuang, Ridgefield, CT (US); Junli Wang, Slingerlands, NY (US)

(73) Assignee: International Business Machines Corporation, Armonk, NY (US)

(*) Notice: Subject to any disclaimer, the term of this patent is extended or adjusted under 35 U.S.C. 154(b) by 381 days.

(21) Appl. No.: 18/542,995

(22) Filed: Dec. 18, 2023

(65) Prior Publication Data

US 2025/0204026 A1 Jun. 19, 2025

(51) Int. Cl.

| | |
|---|---|
| ***H10D 84/80*** | (2025.01) |
| ***H10D 8/00*** | (2025.01) |
| ***H10D 8/01*** | (2025.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10W 20/41*** | (2026.01) |

(52) U.S. Cl.

CPC ........... *H10D 84/811* (2025.01); *H10D 8/045* (2025.01); *H10D 8/422* (2025.01); *H10D 30/014* (2025.01); *H10D 30/43* (2025.01); *H10D 30/6735* (2025.01); *H10D 62/121* (2025.01); *H10D 64/017* (2025.01); *H10W 20/427* (2026.01)

(58) Field of Classification Search

CPC ...... H10D 84/811; H10D 8/045; H10D 8/422; H10D 30/014; H10D 30/43; H10D 30/6735; H10D 62/121; H10D 64/017; H10D 30/019; H10D 30/501; H10D 84/832; H10D 8/00; H10D 84/0109; H10D 88/00; H10D 30/6757; H10W 20/427; B82Y 10/00

See application file for complete search history.

(56) References Cited

U.S. PATENT DOCUMENTS

| | | | |
|---|---|---|---|
| 7,489,007 | B2 | 2/2009 | Williams et al. |
| 11,264,405 | B2 | 3/2022 | Morrow et al. |
| 2022/0415878 | A1 | 12/2022 | Wu et al. |

(Continued)

OTHER PUBLICATIONS

Horiguchi, Naoto, and Eric Beyne. "Backside Power Delivery." Imec, Nov. 25, 2022 Downloaded from URL<www.imec-int.com/en/articles/how-power-chips-backside> on Feb. 25, 2026. (Year: 2022).*

(Continued)

*Primary Examiner* — J. E. Schoenholtz

(74) *Attorney, Agent, or Firm* — Harrity & Harrity, LLP

(57) ABSTRACT

A semiconductor device is provided. The semiconductor device includes a stacked field effect transistor (FET) formed on a substrate and connected to a backside metal line of a backside power distribution network (BSPDN). The semiconductor device also includes a lateral junction diode co-integrated with the stacked nanosheet FET.

18 Claims, 14 Drawing Sheets

P+N DIODE STACKED FETs

(56) References Cited

U.S. PATENT DOCUMENTS

2023/0088578 A1* 3/2023 Thomson ............. H10D 84/811
257/351

OTHER PUBLICATIONS

Peters, Laura, "Challenges In Backside Power Delivery," Semiconductor Engineering, Nov. 17, 2022, 9 pages, Retrieved from https://semiengineering.com/challenges-in-backside-power-delivery/.

"Backside Power Delivery," Imec, 2022, 22 pages, https://www.imec-int.com/en/articles/how-power-chips-backside.

* cited by examiner

SEMICONDUCTOR DEVICE WITH LATERAL DIODES AND STACKED FETS

BACKGROUND

The present disclosure relates to fabrication methods and resulting structures for semiconductor devices. More specifically, the present disclosure relates to fabrication methods and resulting structures for semiconductor devices with lateral junction diodes and field effect transistors (FETs).

In certain semiconductor device fabrication processes, a large number of semiconductor devices, such as n-type field effect transistors (nFETs) and p-type field effect transistors (pFETs), may be fabricated on a single wafer. Non-planar transistor device architectures (e.g., fin-type FETs (FinFETs) and nanosheet FETs) can provide increased device density and increased performance over planar transistors. To further increase the transistor density, one approach is to stack one device over another to double the active density at a given footprint. The stacked FET can have various different configurations. For a stacked FET to be area scaling competitive, a backside power distribution network (BSPDN) may be implemented. When implementing a BSPDN with the stacked FET, flipping of the semiconductor device and thinning of the wafer may occur.

SUMMARY

Embodiments of the present disclosure relate to a semiconductor device. The semiconductor device includes a stacked field effect transistor (FET) formed on a substrate and connected to a backside metal line of a backside power distribution network (BSPDN). The semiconductor device also includes a lateral junction diode co-integrated with the stacked nanosheet FET.

Embodiments of the present disclosure relate to an electronic device. The electronic device includes a semiconductor device that includes a stacked field effect transistor (FET) formed on a substrate and connected to a backside metal line of a backside power distribution network (BSPDN). The semiconductor device also includes a lateral junction diode co-integrated with the stacked nanosheet FET.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

Figure 1:
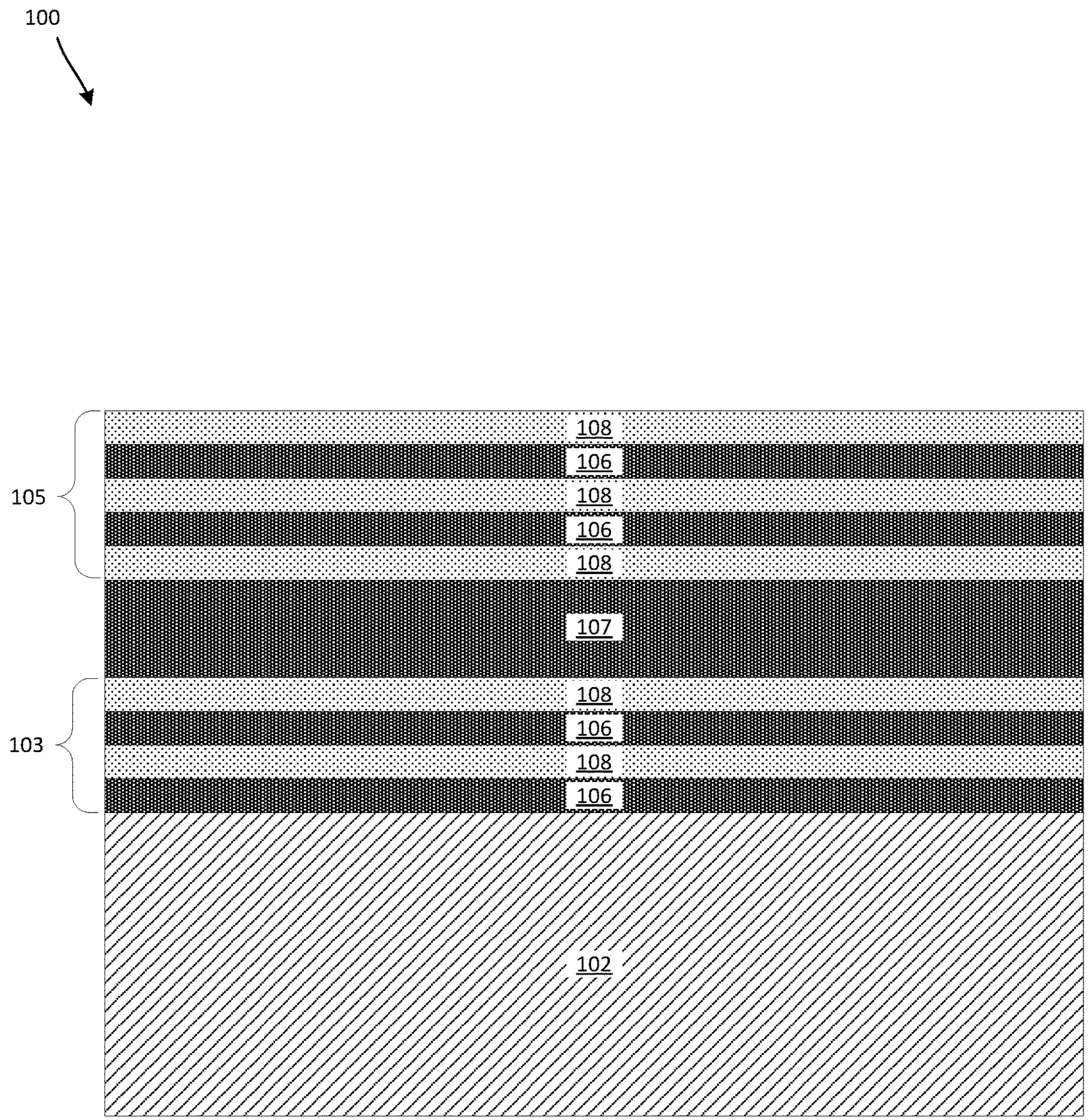
FIG. 1 is a cross-sectional view of a semiconductor device at an intermediate stage of the fabrication process, according to embodiments.

The present disclosure describes semiconductor devices that co-integrate stacked FET devices and lateral junction diodes and methods of manufacturing the semiconductor devices. In particular, the present disclosure describes a semiconductor device and methods of manufacturing the semiconductor device that includes a stacked field effect transistor (FET) formed on a substrate and connected to a backside metal line of a backside power distribution network (BSPDN). The semiconductor device also includes a lateral junction diode co-integrated with the stacked nanosheet FET. In general, as used herein, the term "co-integrated" means that both types of devices are present on the same microchip (or semiconductor wafer, or chip, or integrated circuit device, etc.).

The flowcharts and cross-sectional diagrams in the FIGURES illustrate methods of manufacturing lateral junction diodes and stacked FET devices according to various embodiments. In some alternative implementations, the manufacturing steps may occur in a different order than that which is noted in the FIGURES, and certain additional manufacturing steps may be implemented between the steps noted in the FIGURES. Moreover, any of the layered structures depicted in the FIGURES may contain multiple sublayers.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

In general, a metal-oxide-semiconductor field-effect transistor (MOSFET) may be used for amplifying or switching electronic signals. The MOSFET has a source electrode, a drain electrode, and a metal oxide gate electrode. The metal gate portion of the metal oxide gate electrode is electrically insulated from the main semiconductor n-channel or p-channel by a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (nFET) and p-type field effect transistors (pFET) are two types of complementary MOSFETs. The nFET includes n-doped source and drain junctions and uses electrons as the current carriers. The pFET includes p-doped source and drain junctions and uses holes as the current carriers. Complementary metal oxide semiconductor (CMOS) is a technology that uses complementary and symmetrical pairs of p-type and n-type MOSFETs to implement logic functions. As mentioned above, hole mobility on the pFET may have an impact on overall device performance.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nanosheets. In a known GAA configuration, a nanosheet-based FET includes a source region, a drain region and stacked nanosheet channels between the source and drain regions. Semiconductor nanosheet FET devices typically include one or more suspended nanosheets that serve as the channel. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. In some implementations, the channel nanosheet of a p-type FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below.

In general, a diode is a two-terminal electronic component that conducts current primarily in one direction (asymmetric conductance). It has low (ideally zero) resistance in one direction and high (ideally infinite) resistance in the other. A semiconductor diode is a crystalline piece of semiconductor material with a p-n junction connected to two electrical terminals. A p-n junction diode is made of a crystal of semiconductor, usually silicon, but germanium and gallium arsenide are also used. Impurities (i.e., n-type and p-type impurities) are added to it to create a region on one side that contains negative charge carriers (electrons), called an n-type semiconductor, and a region on the other side that contains positive charge carriers (holes), called a p-type semiconductor. When the n-type and p-type materials are attached together, a momentary flow of electrons occurs from the n side to the p side resulting in a third region between the two where no charge carriers are present. This region is called the depletion region because there are no charge carriers (neither electrons nor holes) in it. The diode's terminals are attached to the n-type and p-type regions. The boundary between these two regions called a p-n junction. When a sufficiently higher electrical potential is applied to the p side (the anode) than to the n side (the cathode), it allows electrons to flow through the depletion region from the n-type side to the p-type side. The junction does not allow the flow of electrons in the opposite direction when the potential is applied in reverse. A lateral junction diode refers to a configuration of the diode were the n-type side is coplanar (i.e., formed at a same level in a thickness direction of the device) with the p-type side.

Referring now to the drawings in which like numerals represent the same or similar elements and initially to FIG. 1, this figure depicts a cross-sectional view of a semiconductor device 100 at an intermediate stage of the manufacturing process, according to embodiments. In particular, FIG. 1 illustrates the process at a stage after forming the multi-layer stacked nanosheets. As shown in FIG. 1, a substrate 102 is provided. The substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate. The substrate 102 may be comprised of any other suitable material(s) than those listed above.

Referring again to FIG. 1, the semiconductor device 100 includes alternating layers of a sacrificial layer 106 and a semiconductor layer 108. The bottom nanosheet stack 103 initially includes a sacrificial layer 106 that is formed on the substrate, followed by the formation of a semiconductor layer 108. In an example, the sacrificial layer 106 is composed of silicon-germanium (e.g., SiGe35, or more generally, where the Ge ranges from about 15-35%). Next, the first (or bottommost) semiconductor layer 108 is formed on an upper surface of the first one of the sacrificial layers 106. In an example, the semiconductor layer 108 is composed of silicon. Several additional layers of the sacrificial layer 106 and the semiconductor layer 108 are alternately formed to create the bottom nanosheet stack 103. It should be appreciated that any suitable number of alternating layers of sacrificial layers 106 and semiconductor layers 108 may be formed. A middle sacrificial layer 107 (such as SiGe with Ge % 50~70%, which will be converted to a dielectric layer later) is formed on the bottom nanosheet stack 103. In a process similar to that described above, a top nanosheet stack 105 is formed on the middle sacrificial layer 107. It should be appreciated that the total number of alternating layers in the top nanosheet structure NS2 may be any suitable number. In certain embodiments, the material of the middle sacrificial layer 107 is the same as the material of the other sacrificial layers 106.

In certain embodiments, the sacrificial layers 106 have a vertical thickness ranging, for example, from approximately 3 nm to approximately 20 nm. In certain embodiments, the semiconductor layers 108 have a vertical thickness ranging, for example, from approximately 3 nanometers (nm) to approximately 10 nm. Although the range of 3-20 nm is cited as an example range of thickness, other thicknesses of these layers may be used. In certain examples, certain of the sacrificial layers 106 and/or the semiconductor layers 108 may have different thicknesses relative to one another. Therefore, multiple epitaxial growth processes can be performed to form the sacrificial layers 106 and the semiconductor layers 108.

In certain embodiments, it may be desirable to have a small vertical spacing (VSP) between adjacent nanosheet layers in a stack of nanosheets to reduce the parasitic capacitance and to improve circuit speed. For example, the VSP (the distance between the bottom surface of a first nanosheet layer and the top surface of an adjacent second nanosheet layer) may range from 5 nm to 15 nm. However, the VSP must be of a sufficient value to accommodate the gate stack that will be formed in the spaces created by later removal of the sacrificial layers.

Figure 2:
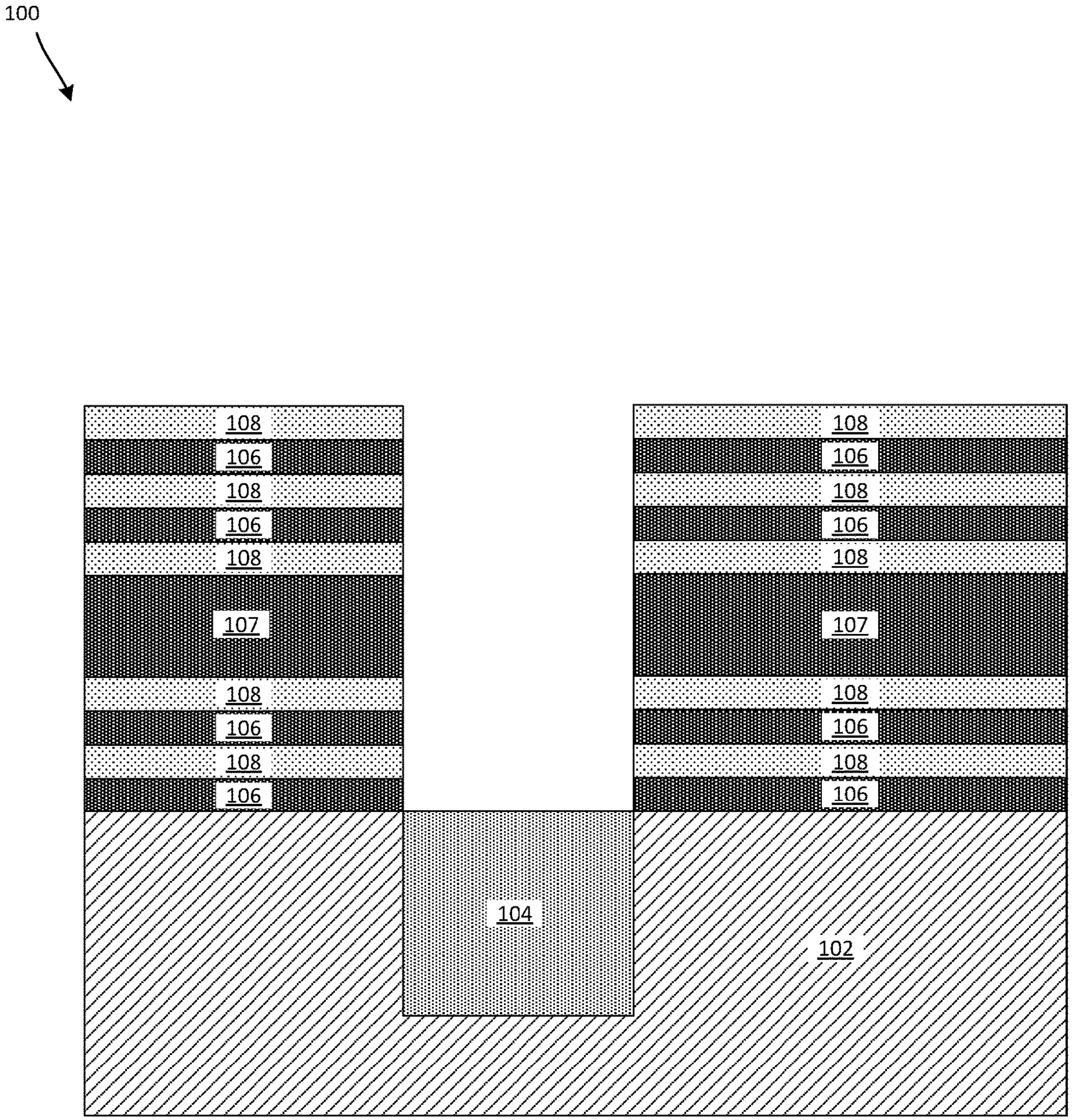
FIG. 2 is a cross-sectional view of the semiconductor device of FIG. 1 after additional fabrication operations, according to embodiments.

Referring now to FIG. 2, this figure depicts a cross-sectional view of the semiconductor device 100 of FIG. 1 at a subsequent stage of the manufacturing process, according to embodiments. As shown in FIG. 2, a suitable material removal process is utilized to divide the bottom nanosheet stack 103 and the top nanosheet stack 105 into two separate portions. The left portion, as shown in FIG. 2, will be subsequently formed into the stacked nanosheet structure (labelled as stacked FETs in FIG. 4), and the right portion will subsequently be removed to allow for the formation of the lateral junction diode (labelled as P+N diode in FIG. 4). As also shown in FIG. 2, a shallow trench isolation (STI) region 104 is formed into the semiconductor substrate 102. In general, shallow trench isolation is an integrated circuit feature which prevents electric current leakage between adjacent semiconductor device components. STI is generally used on CMOS process technology nodes of 250 nanometers and smaller. STI regions are created early during the semiconductor device fabrication process before transistors are formed. The key steps of the STI process involve etching a pattern of trenches in the silicon, depositing one or more dielectric materials (such as silicon dioxide) to fill the trenches, and removing the excess dielectric using a technique such as chemical-mechanical planarization.

Figure 3:
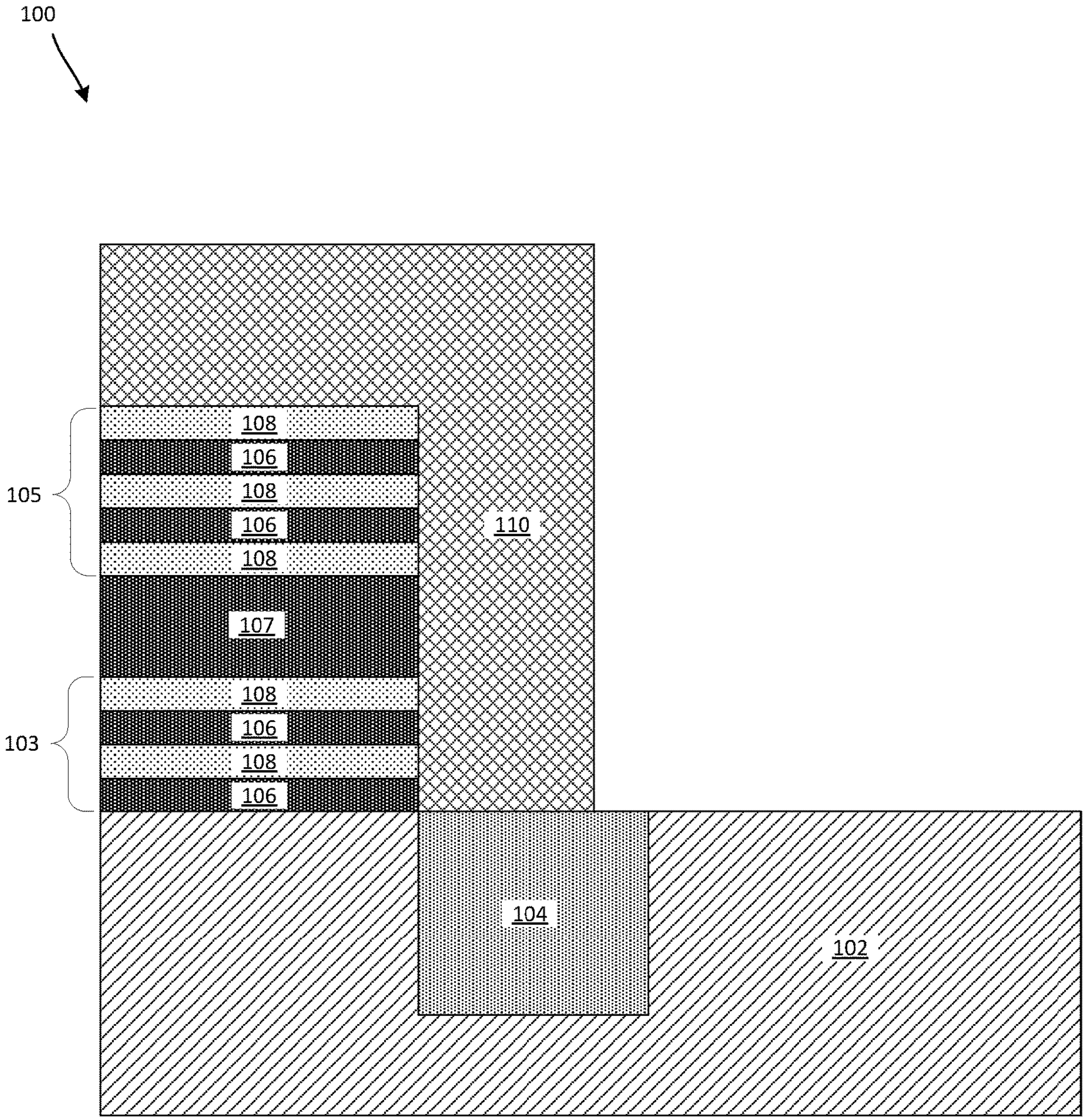
FIG. 3 is a cross-sectional view of the semiconductor device of FIG. 2 after additional fabrication operations, according to embodiments.

Referring now to FIG. 3, this figure depicts a cross-sectional view of the semiconductor device 100 of FIG. 2 at a subsequent stage of the manufacturing process, according to embodiments. As shown in FIG. 3, an organic planarization (OPL) layer 110 is formed to cover the bottom nanosheet stack 103 and the top nanosheet stack 105. Although not shown in FIG. 3, one example process for forming the OPL layer 110 is to initially cover the entire semiconductor device 100 with this layer, then cover the OPL layer with a mask on the left side of the device, then use a suitable material removal process to remove the top and bottom nanosheet stacks on the right side of the semiconductor device 100 down to the level of the substrate 102. Therefore, the space created on the right side of the semiconductor device 100 will allow for the subsequent formation of the lateral junction diode.

Figure 4:
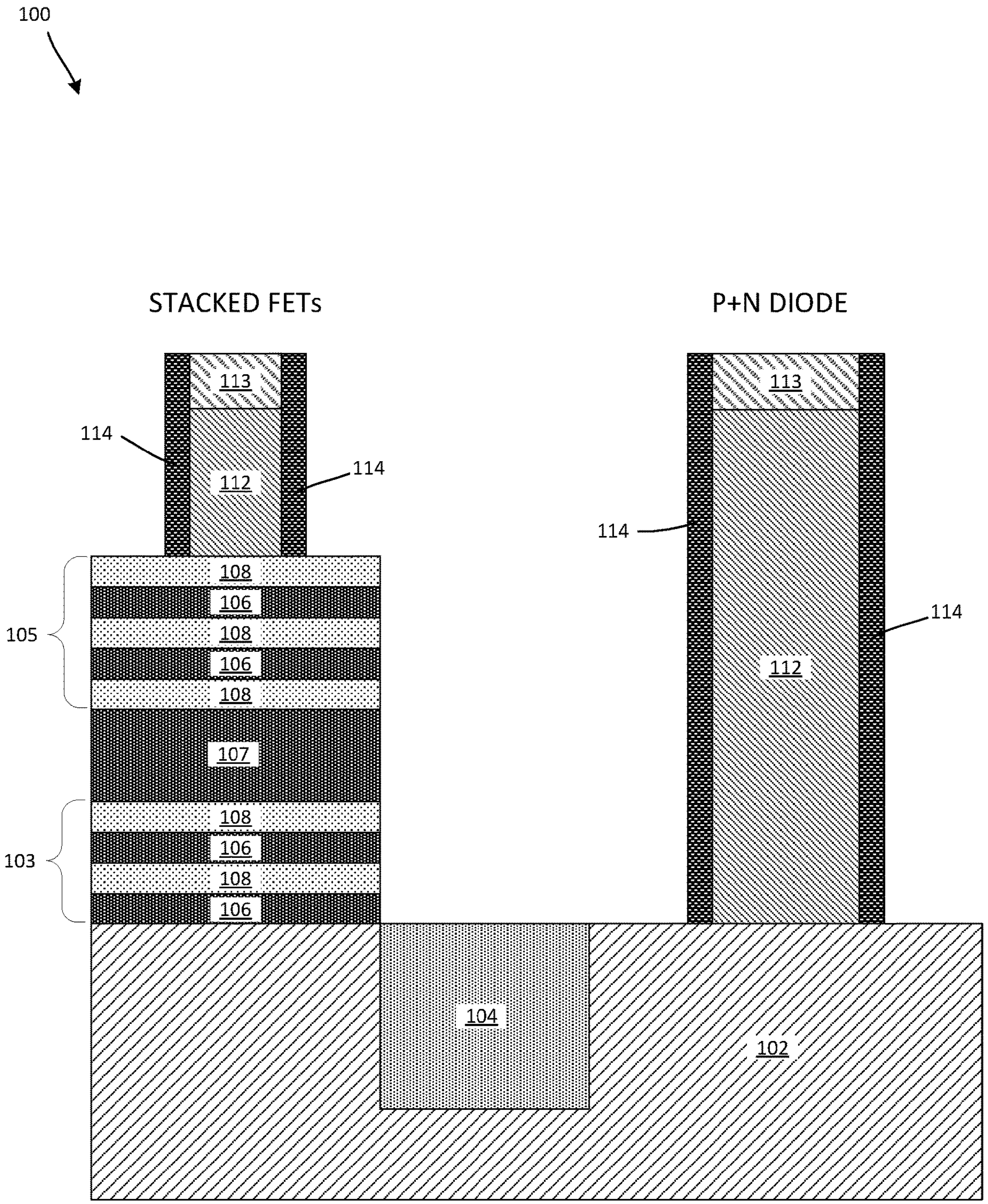
FIG. 4 is a cross-sectional view of the semiconductor device of FIG. 3 after additional fabrication operations, according to embodiments.

Referring now to FIG. 4, this figure depicts a cross-sectional view of the semiconductor device 100 of FIG. 3 at a subsequent stage of the manufacturing process, according to embodiments. As shown in FIG. 4, the OPL layer 110 is removed. Then, a dummy gate 112 is formed on the top nanosheet stack 105 and on the substrate 102 on the right side of the semiconductor device 100 where the lateral junction diode will be formed. The dummy gate 112 may be formed by any suitable deposition technique known to one of skill in the art. In one example, the dummy gate 112 is formed by depositing a thin $SiO_2$ dummy gate oxide layer (not shown), followed by depositing a layer of amorphous silicon (a-Si) as the dummy gate 112. The dummy gate 112 may be composed of polycrystalline silicon (poly silicon), amorphous silicon, and/or an oxide, such as, $SiO_2$. Then, a gate hardmask 113 is formed on the dummy gate 112, followed by the formation of a gate spacer 114. The gate spacer 114 may initially be formed to cover the entire semiconductor device 100 and then portions thereof are removed resulting in the structure of the gate spacers 114 shown in FIG. 4. In certain examples, the gate spacer 114 may include one or more nitride-based materials. These gate spacers 114 cover the sidewalls of the dummy gates 112 and the sidewalls of the gate hardmask 113.

Figure 5:
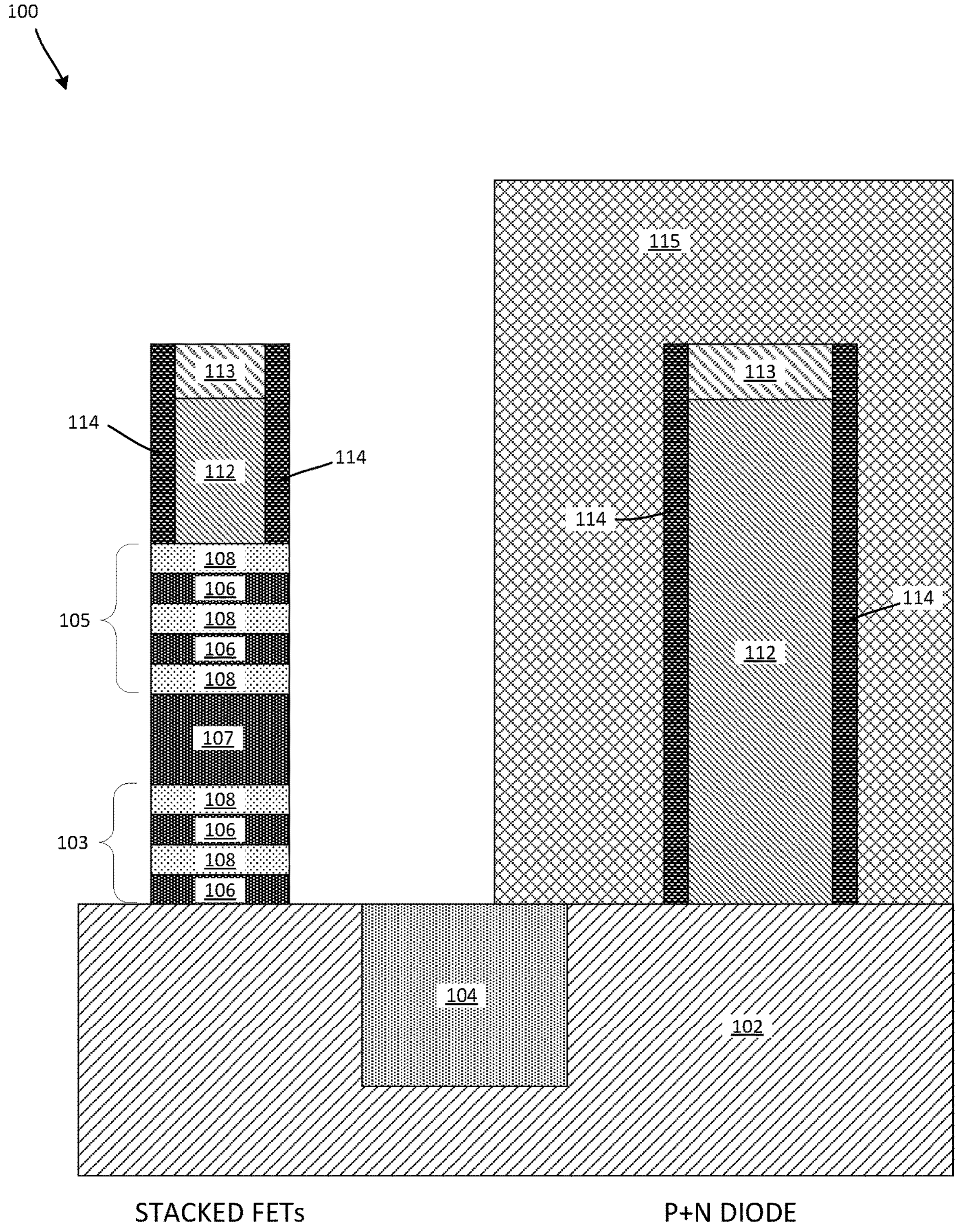
FIG. 5 is a cross-sectional view of the semiconductor device of FIG. 4 after additional fabrication operations, according to embodiments.

Referring now to FIG. 5, this figure depicts a cross-sectional view of the semiconductor device 100 of FIG. 4 at a subsequent stage of the manufacturing process, according to embodiments. As shown in FIG. 5, a second OPL layer 115 is formed to cover the right side of the semiconductor device 100 where the lateral P+N diode is being formed. Then, using the gate hardmask 113 and the gate spacers 114 as a combined mask, a suitable material removal process such as reactive ion etching (RIE) is used to remove the portions of the bottom nanosheet stack 103 and the top nanosheet stack 105 that are not covered by the gate hardmask 113 and the gate spacers 114. This forms a fin structure of the nanosheet stacks on the logic side (i.e., the left side of the semiconductor device 100 including the stacked FETs).

Figure 6:
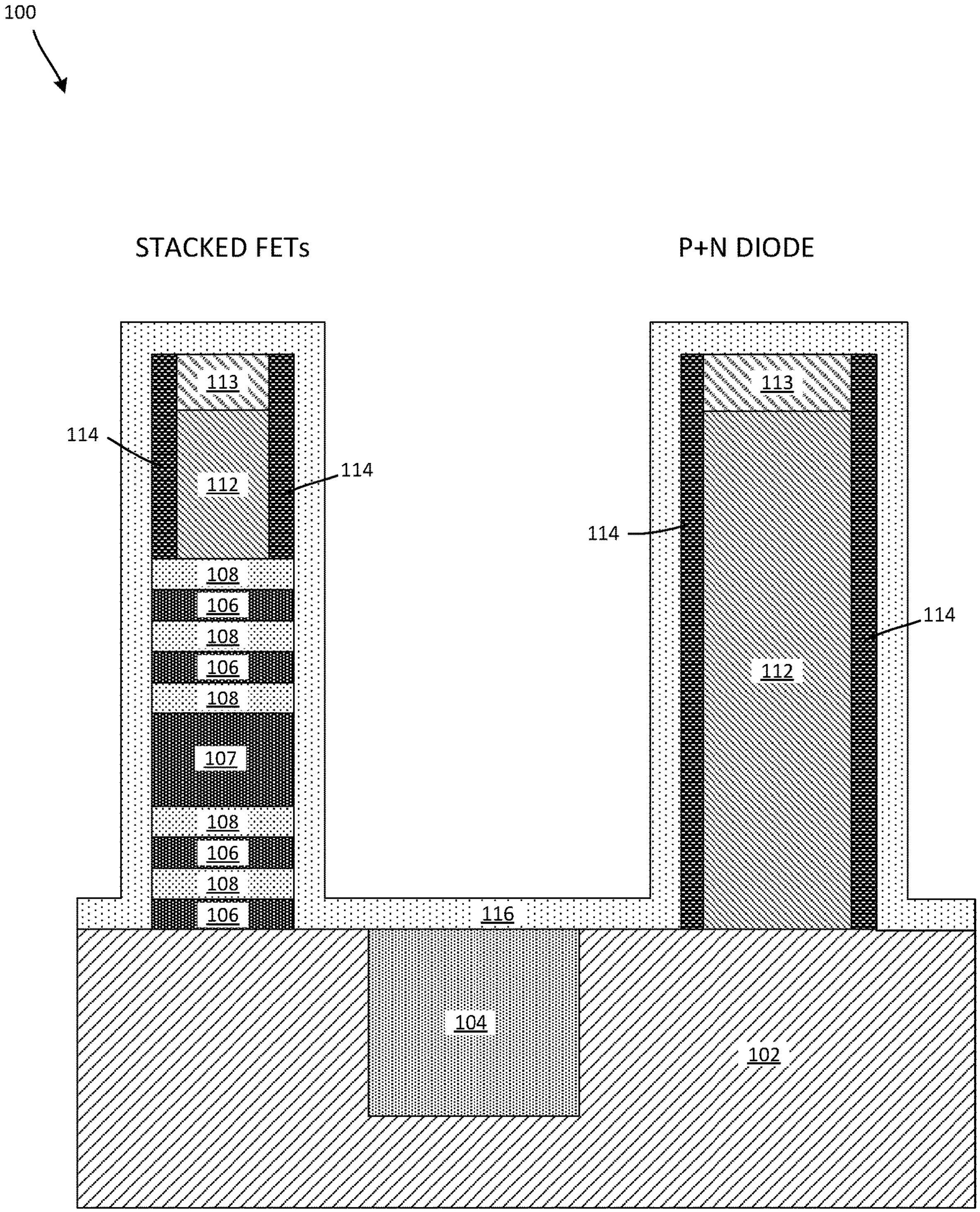
FIG. 6 is a cross-sectional view of the semiconductor device of FIG. 5 after additional fabrication operations, according to embodiments.

Referring now to FIG. 6, this figure depicts a cross-sectional view of the semiconductor device 100 of FIG. 5 at a subsequent stage of the manufacturing process, according to embodiments. As shown in FIG. 6, after the second OPL layer 115 is removed, an ion-implant (I/I) protective liner layer 116 is formed to cover the entire surface of the semiconductor device 100. The I/I protective liner layer 116 may include, for example, one or more nitride-based or oxide-based materials. The I/I protective liner layer 116 may be formed to a suitable thickness such that it functions as a protective layer that prevents epitaxial growth from occurring, but is thin enough to still allow for ion implantation to occur and form the n-type and p-type region of the P+N diode, as discussed in further detail below.

Figure 7:
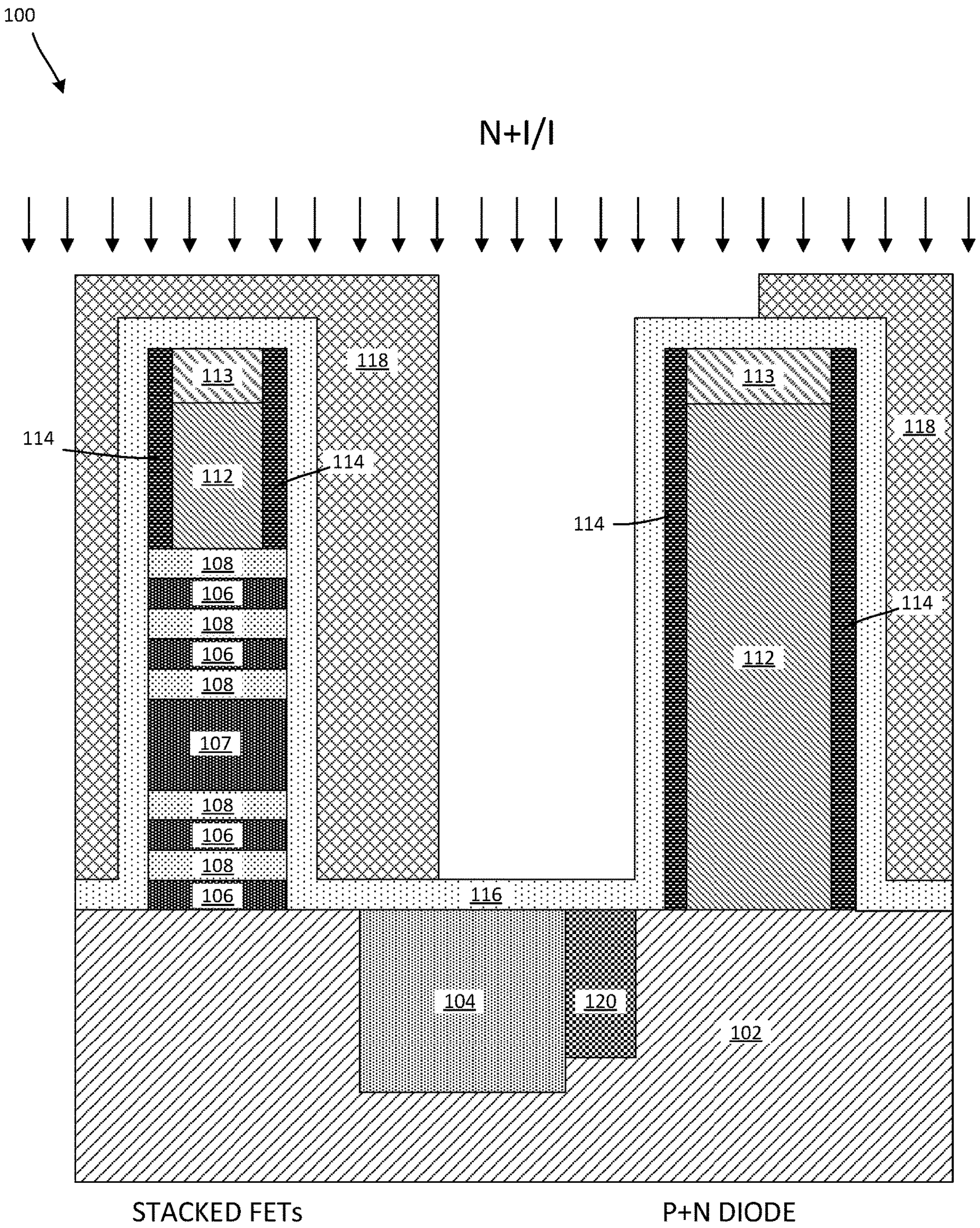
FIG. 7 is a cross-sectional view of the semiconductor device of FIG. 6 after additional fabrication operations, according to embodiments.

Referring now to FIG. 7, this figure depicts a cross-sectional view of the semiconductor device 100 of FIG. 6 at a subsequent stage of the manufacturing process, according to embodiments. As shown in FIG. 7, a photoresist layer 118 is formed to cover the entire stacked FET structure and to also cover the right side of the P+N diode (i.e., the lateral junction diode). Then, a first ion implantation step is performed to form the N+ region 120 of the P+N diode. That is, N+ ions are implanted into the semiconductor material (e.g., silicon) of the substrate 102 through the I/I protective liner layer to form the N+ region 120 of the lateral junction diode. The absence of the photoresist layer 118 thus allows ions to be implanted in this region, while the presence of the photoresist layer 118 prevents ion implantation in other areas of the semiconductor device 100. Although not shown in FIG. 7, the photoresist layer 118 is removed after this first ion implantation step. It should be appreciated that this processing step contributes to the formation of the P+N diode but does not contribute anything to the formation of the stacked FETs.

Figure 8:
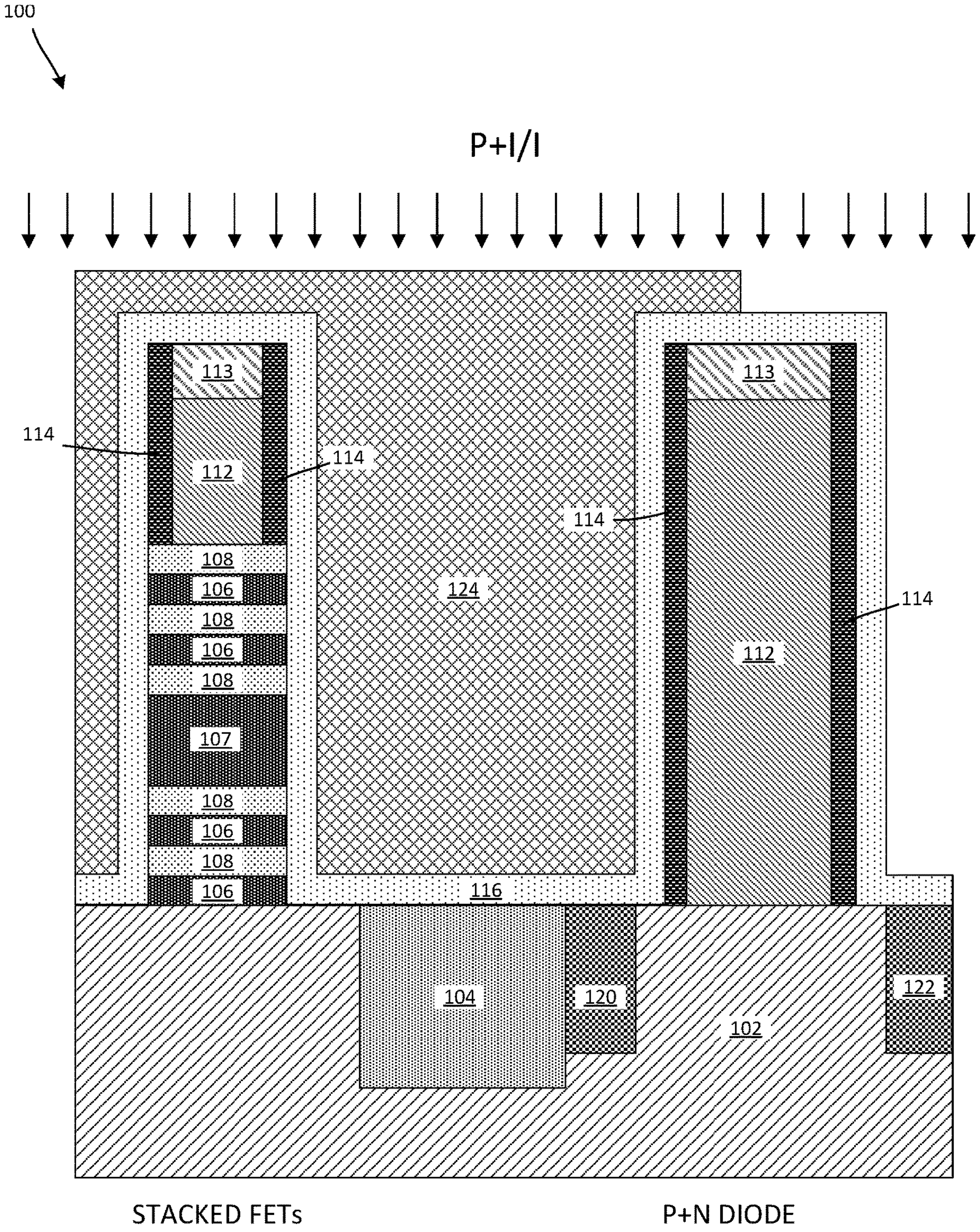
FIG. 8 is a cross-sectional view of the semiconductor device of FIG. 7 after additional fabrication operations, according to embodiments.

Referring now to FIG. 8, this figure depicts a cross-sectional view of the semiconductor device 100 of FIG. 7 at a subsequent stage of the manufacturing process, according to embodiments. As shown in FIG. 8, a second photoresist layer 124 is formed to cover the entire stacked FET structure and to also cover left side of the P+N diode (i.e., the side where the N+ region 120 was formed). Then, a second ion implantation step is performed to form the P+ region 122 of the P+N diode. That is, P+ ions are implanted into the semiconductor material (e.g., silicon) of the substrate 102 through the I/I protective liner layer to form the P+ region 122 of the lateral junction diode. The absence of the second photoresist layer 124 thus allows ions to be implanted in this region, while the presence of the second photoresist layer 124 prevents ion implantation in other areas of the semiconductor device 100. Although not shown in FIG. 8, the second photoresist layer 124 is removed after the second ion implantation step. It should be appreciated that this processing step contributes to the formation of the P+N diode but does not contribute anything to the formation of the stacked FETs. Thus, at this stage in the manufacturing process, the lateral junction diode includes both the N+ (or n-type) region 120 and the P+ (or p-type) region 122.

In certain embodiments, the area of the substrate 102 between the N+ region 120 and the P+ region 122 (also referred to as the intrinsic region) may be a lighter doped region (i.e., with a doping concentration less that either of the N+ region 120 or the P+ region 122). In other embodiments, depending on the desired performance characteristics of the lateral junction diode, the area of the substrate 102 between the N+ region 120 and the P+ region 122 may be either a lighter n-doped (i.e., a P+/N/N+ type lateral junction diode) or lighter p-doped (i.e., a P+/P/N+ type lateral junction diode). In these other embodiments, the lighter n-doped central well region, or lighter p-doped central well region may be doped while the substrate is exposed and prior to the formation of the dummy gate 112 shown in FIG. 4. In certain examples, the lighter doped regions may have a dopant concentration ranging from 1e+17 to 1e+19 $cm^3$. It should also be appreciated that in certain embodiments, the area of the substrate 102 between the N+ region 120 and the P+ region 122 (also referred to as the intrinsic region) may be undoped.

Figure 9:
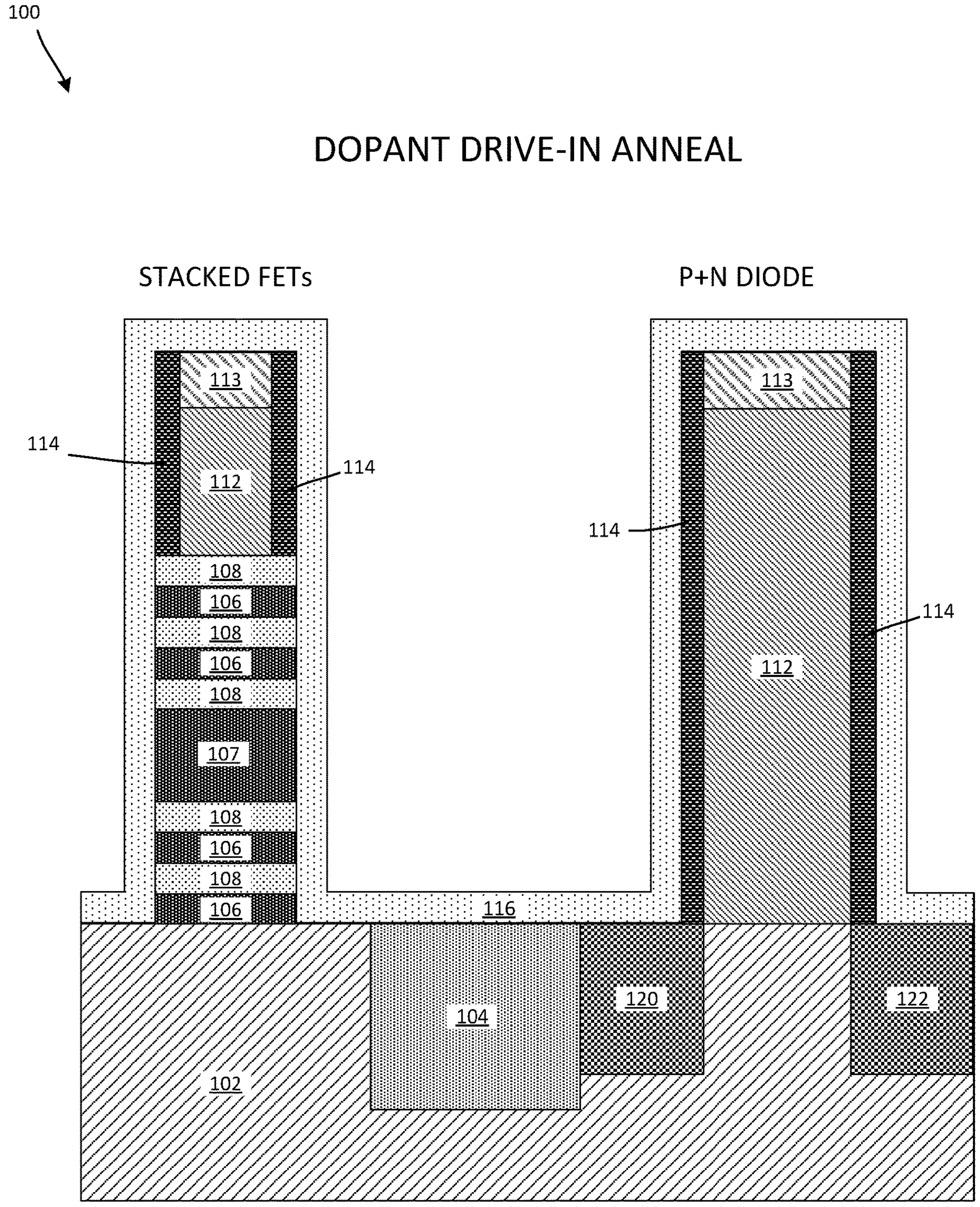
FIG. 9 is a cross-sectional view of the semiconductor device of FIG. 8 after additional fabrication operations, according to embodiments.

Referring now to FIG. 9, this figure depicts a cross-sectional view of the semiconductor device 100 of FIG. 8 at a subsequent stage of the manufacturing process, according to embodiments. As shown in FIG. 9, a thermal annealing step is performed to allow the dopants in the N+ region 120 and the P+ region 122 to expand out (or diffuse out) so that these regions are closer to an area under the gate spacer 114 above the lateral junction diode.

Figure 10:
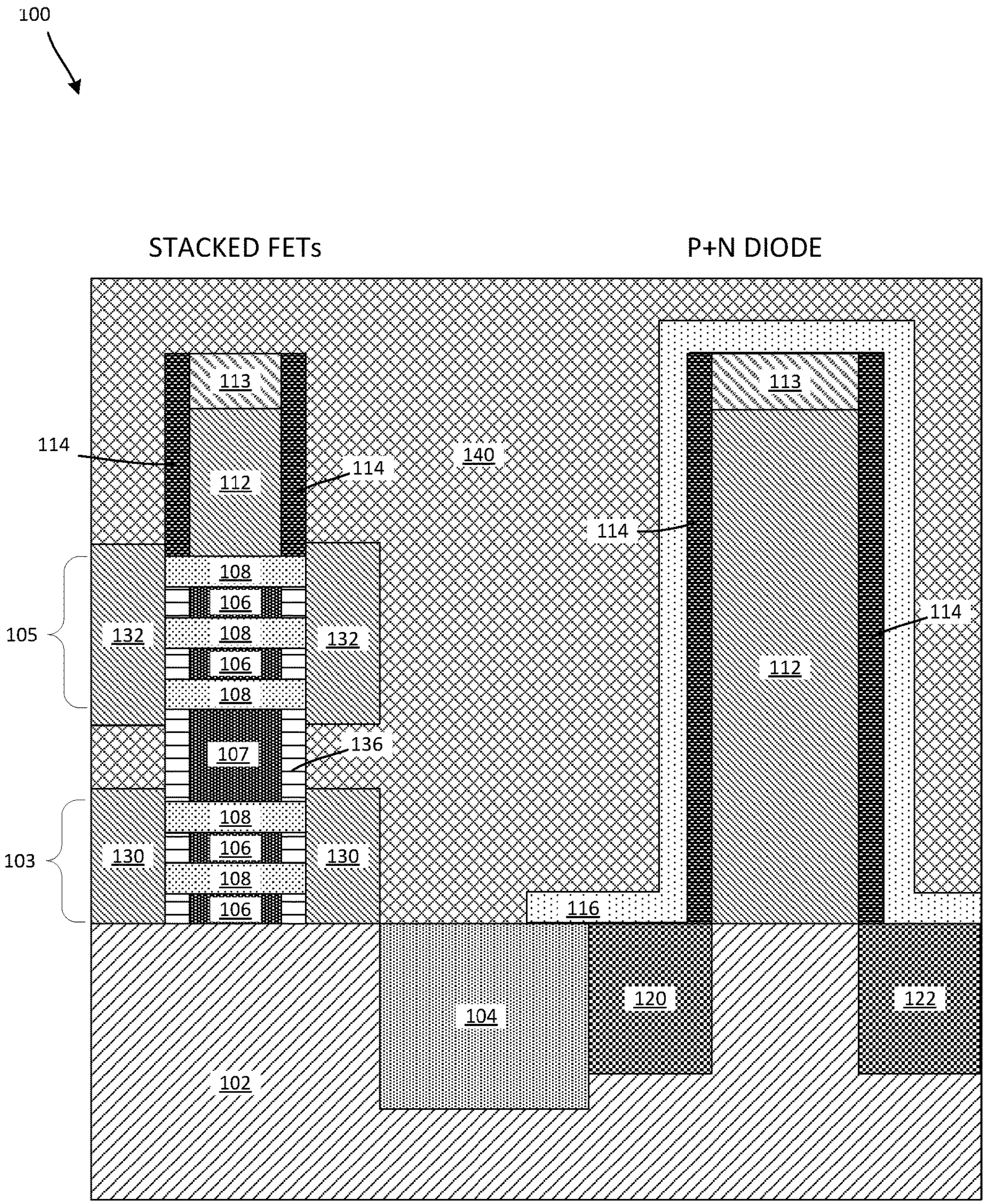
FIG. 10 is a cross-sectional view of the semiconductor device of FIG. 9 after additional fabrication operations, according to embodiments.

Referring now to FIG. 10, this figure depicts a cross-sectional view of the semiconductor device 100 of FIG. 9 at a subsequent stage of the manufacturing process, according to embodiments. As shown in FIG. 10, a portion of the ion-implant (I/I) protective liner layer 116 that covers the stacked FETs is removed. It should be noted that one function of the I/I protective liner layer 116 is to prevent epitaxial growth from occurring. It should also be noted that at this stage of the manufacturing process, the formation of the P+N diode is paused while the formation of the stacked FETs is resumed. FIG. 10 shows the semiconductor device 100 after several processing steps are applied to the stacked FETs. As shown in FIG. 10, the sacrificial layers 106 of the bottom nanosheet stack 103 and the top nanosheet stack 105 at the source/drain regions of the stacked FETs are recessed inwardly in a horizontal direction, followed by inner spacer 136 formation (only one labeled in FIG. 10 for clarity). A selective etching process using, for example, a boron-based chemistry or a chlorine-based chemistry may be used, which selectively recesses the exposed portions of the sacrificial layers 106 without significantly attacking the surrounding materials. Then, the inner spacers 136 are formed in the indents created by the removal of the portions of the sacrificial layers 106. An isotropic etching process may be performed to clean up the edges of the inner spacers 136 and the semiconductor layers 108. Then, a first source/drain (S/D) epitaxial layer 130 is formed on the bottom nanosheet stack 103. In certain embodiments, the first S/D epitaxial layer 130 includes a p-type dopant. However, in other embodiments, the first S/D epitaxial layer 130 includes an n-type dopant. Then, a second source/drain (S/D) epitaxial layer 132 is formed on the top nanosheet stack 105. In certain embodiments, the second S/D epitaxial layer 132 includes a p-type dopant. However, in other embodiments, the second S/D epitaxial layer 132 includes an n-type dopant. Also, an ILD layer 140 is formed in areas between the first S/D epitaxial layer 130 and the second S/D epitaxial layer 132, and in areas between the stacked FETs and the lateral P+N diode. It should be appreciated that in certain embodiments, a portion of the ILD layer 140 may be formed on the first S/D epitaxial layer 130 prior to the formation of the second S/D epitaxial layer 132.

In general, in determining the difference between p-type and n-type semiconductors, factors such as the doping elements, the effect of the doping elements, the majority and minority carriers in both types are taken into consideration. Additionally, the density of electrons and holes, energy levels and Fermi level, the direction of movement of majority carriers, are also accounted for in clarifying the disparity between p-type and n-type semiconductors. Thus, as a main difference, in n-type semiconductors, the electrons have a negative charge, hence the name n-type. While in p-type semiconductors, the effect of a positive charge is generated in the absence of an electron, hence the name p-type. In certain examples, in a p-type semiconductor, the III group element of the periodic table is added as a doping element, while in n-type the doping element is the V group element. In a p-type semiconductor, the majority carriers are holes, and the minority carriers are electrons, whereas in the n-type semiconductor, electrons are the majority carriers, and holes the minority carriers.

Figure 11:
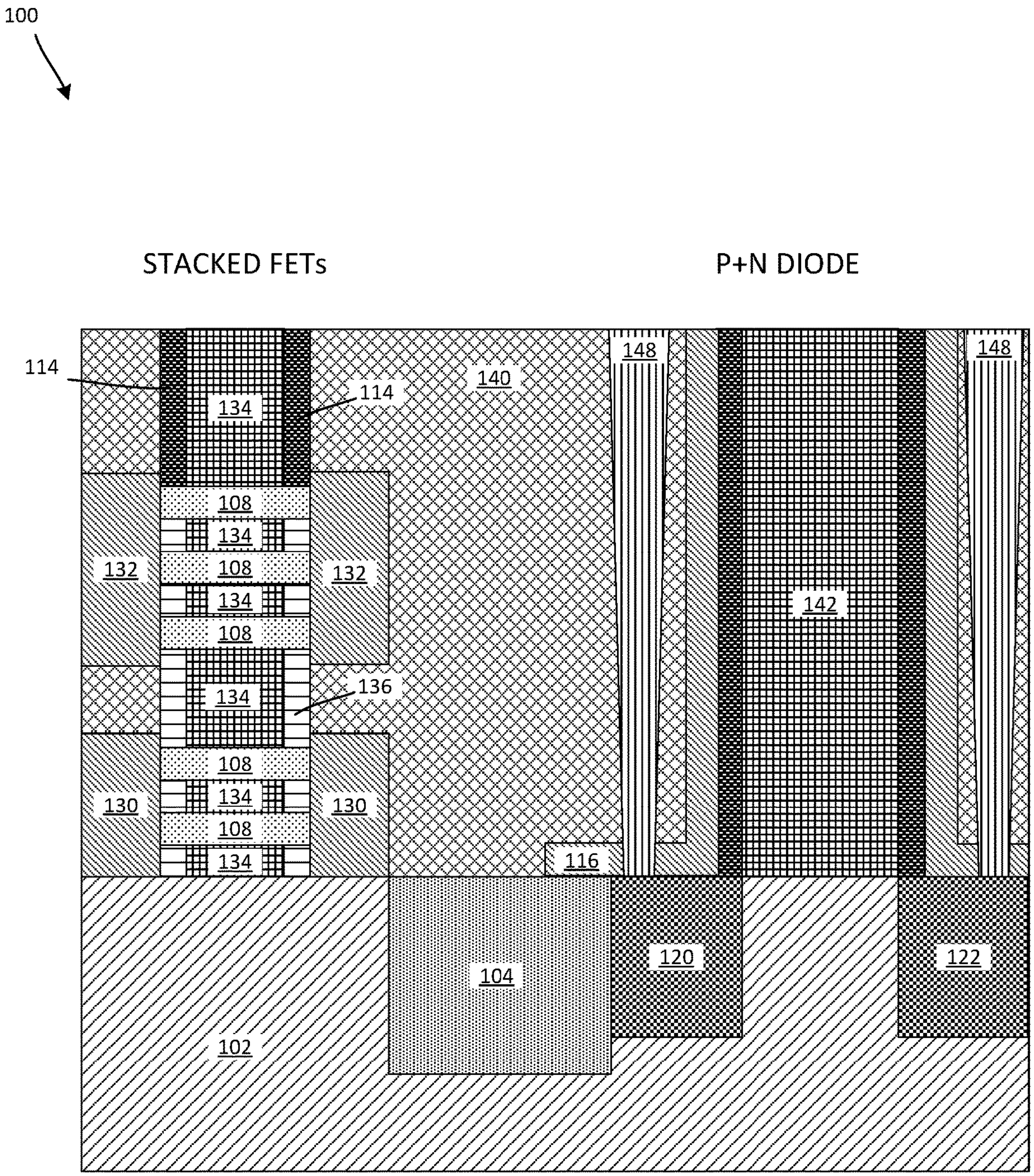
FIG. 11 is a cross-sectional view of the semiconductor device of FIG. 10 after additional fabrication operations, according to embodiments.

Referring now to FIG. 11, this figure depicts a cross-sectional view of the semiconductor device 100 of FIG. 10 at a subsequent stage of the manufacturing process, according to embodiments. As shown in FIG. 11, a gate cut patterning process is performed and the middle sacrificial layer 107, the sacrificial layers 106 and the dummy gate 112 are selectively removed (or released). After the material of the sacrificial layers 106 and the sacrificial layer 107 has been released, a high-k metal gate (HKMG) dielectric layer (not shown) and a gate electrode 134 (i.e., that includes a work function metal (WFM)) are formed in the spaces created by the removal of the SiGe material of the sacrificial layers. At the same time, the dummy gate 112 above the lateral junction diode is released as well. In certain examples, the forming of the gate structure includes forming a continuous layer of gate dielectric material and a gate electrode material inside the gate opening. The continuous layer of gate dielectric material can include silicon oxide, or a dielectric material having a dielectric constant greater than 4.0 (such dielectric materials can be referred to as a high-k metal gate dielectric material). Illustrative examples of high-k gate dielectric materials include metal oxides such as, for example, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite (Pb(Zn,Nb)O). The HKMG dielectric layer dielectric material can further include dopants such as lanthanum (La), aluminum (Al) and/or magnesium (Mg). The continuous layer of the high-κ metal gate can be formed utilizing a deposition process such as, for example, ALD, CVD, PECVD, or PVD. The continuous layer of the HKMG dielectric layer is a conformal layer having a thickness which can range from 1 nm to 10 nm.

The gate electrode 134 may include an NFET or PFET work function metal (WFM) material (depending on whether the first S/D epitaxial layer 130 and the second S/D epitaxial layer 132 is n-type or p-type), and this is deposited in the spaces created by the previous removal of the sacrificial layers 106 in the top nanosheet stack 105 and the bottom nanosheet stack 103 to form the overall gate electrode 134 structure. During the same processing step that the gate electrode 134 is formed, the diode dummy gate 142 is also formed with the same material. It should be appreciated the diode dummy gate 142 is not a functional component of the lateral junction diode. However, as mentioned herein, the previous dummy gate 112 above the lateral junction diode functioned as an I/I mask that helped to define the lateral junction diode doped regions (i.e., the N+ region 120 and the P+ region 122) during the two ion implantation steps.

In some embodiments, the layer of WFM for the stacked FET can be selected to effectuate an n-type threshold voltage shift. "N-type threshold voltage shift" as used herein means a shift in the effective work-function of the work-function metal-containing material towards a conduction band of silicon in a silicon-containing material. In solid-state physics, the work function is the minimum thermodynamic work (i.e., energy) needed to remove an electron from a solid to a point in the vacuum immediately outside the solid surface. Also, this energy (work function) is a measure of how firmly a particular metal holds its electrons. In general, the conduction band is the range of permissible energy values which an electron in a solid material can have that allows the electron to dissociate from a particular atom and become a free charge carrier in the material. In one embodiment, the work function of the n-type work function metal ranges from approximately 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the layer of WFM can be selected to effectuate a p-type threshold voltage shift. In one embodiment, the work function of the p-type work function metal ranges from approximately 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. In general, the valence band is the range of permissible energy values that are the highest energies an electron can have and still be associated with a particular atom of a solid material. Examples of such materials that can effectuate a p-type threshold voltage shift include, but are not limited to, titanium nitride, and tantalum carbide, hafnium carbide, and combinations thereof. The layers of WFM are conformal layers which can be formed by a conformal deposition process such as, for example, ALD, CVD or PECVD. The layer of WFM layer can have a thickness in the range of approximately 1 nm to 20 nm, although other thicknesses above or below this range may be used as desired for a particular application. It should be appreciated that at this stage of the manufacturing process, As also shown in FIG. 11, metallic diode contacts 148 are formed through the ILD layer 140 and the I/I protective liner layer 116 to contact the N+ region 120 of the lateral junction diode (or P+N diode) and the P+ region 122 of the lateral junction diode. Thus, it should be appreciated that at this stage of the manufacturing process, the processing switches back from the stacked FETs to the lateral junction diode. However, in other embodiments, the formation of the diode contacts 148 may be completed at a different stage in the overall manufacturing process of the semiconductor device 100. Moreover, in other embodiments, as shown in FIG. 14, the diode contacts 148 may be formed through an ILD layer 150 on the opposite side of the N+ region 120 and the P+ region 122.

Figure 12:
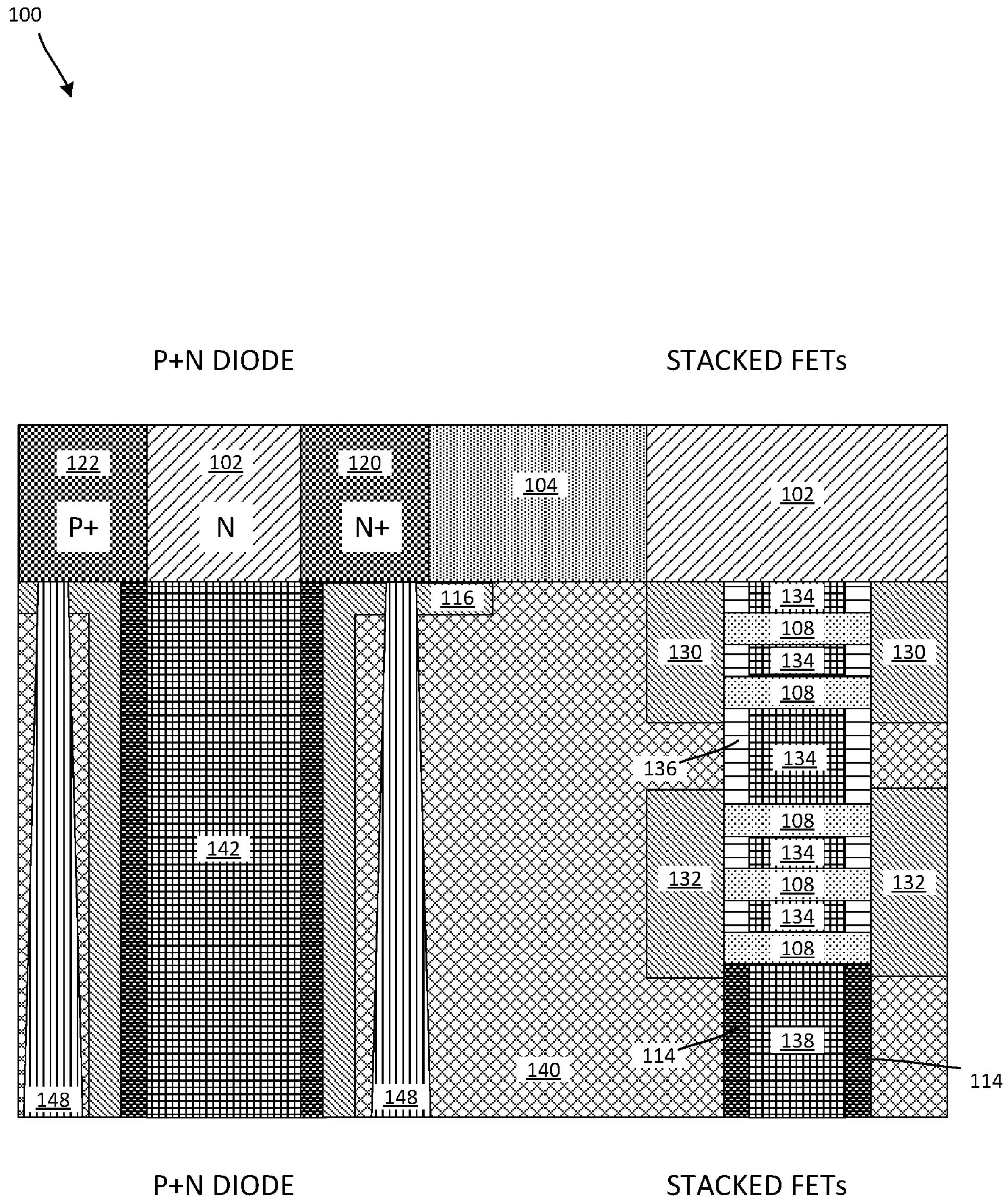
FIG. 12 is a cross-sectional view of the semiconductor device of FIG. 11 after additional fabrication operations, according to embodiments.

Referring now to FIG. 12, this figure depicts a cross-sectional view of the semiconductor device 100 of FIG. 11 at a subsequent stage of the manufacturing process, according to embodiments. As shown in FIG. 12, the overall semiconductor device 100 is flipped upside down and a backside thinning process (i.e., material removal process such as CMP) is performed to expose the surfaces of the N+ region 120, the P+ region 122 and the STI layer 104.

Figure 13:
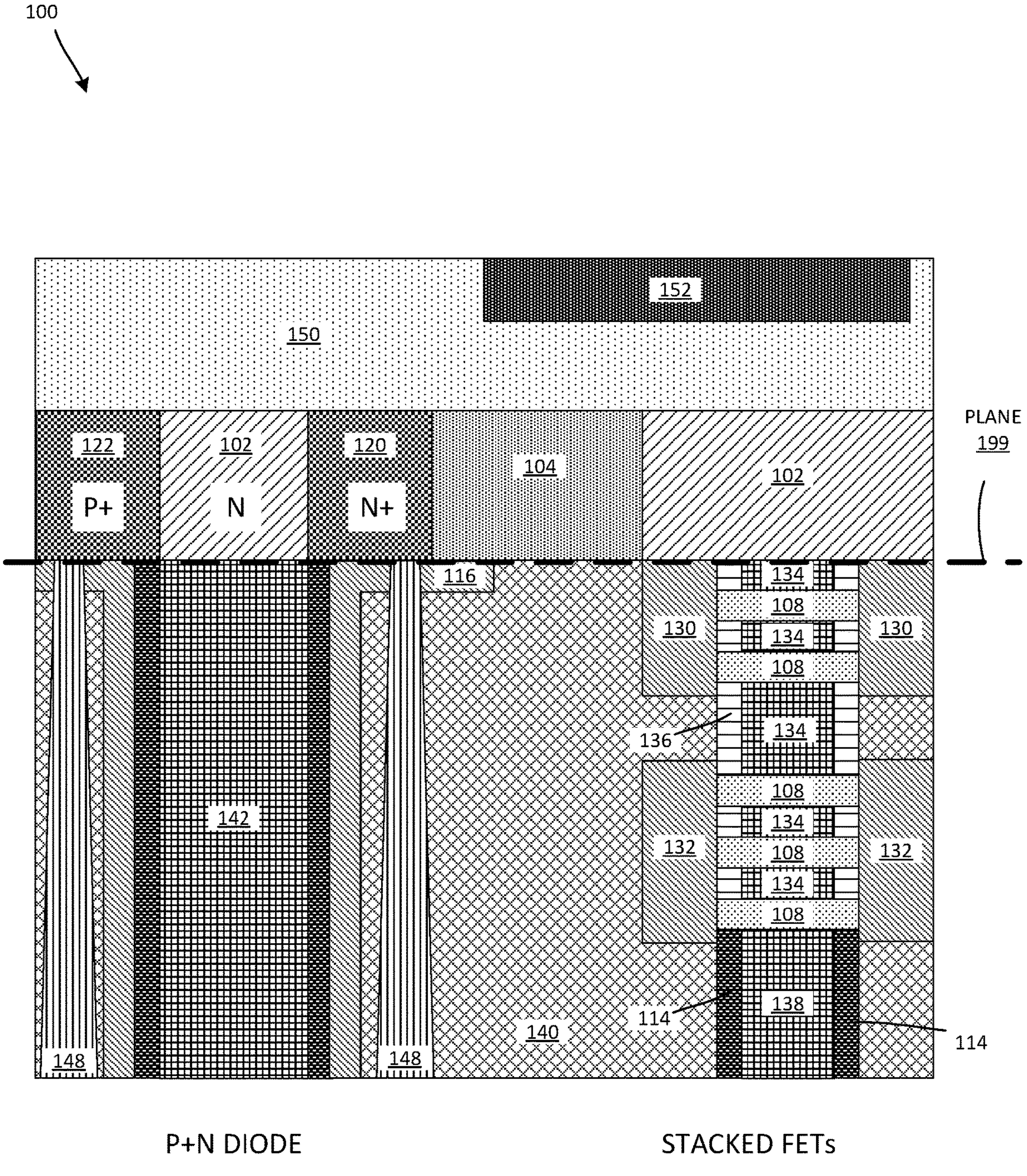
FIG. 13 is a cross-sectional view of the semiconductor device of FIG. 12 after additional fabrication operations, according to embodiments.

Then, as shown in FIG. 13, an ILD layer 150 is formed on the substrate 102, the N+ region 120, the P+ region 122 and the STI layer 104, and one or more backside metal lines 152 of a backside power distribution network (BSPDN) are formed in the ILD layer 150 (note that the metal contact from the backside metal lines 152 to the stacked FETs is not shown in FIG. 13). Thus, the metallic diode contacts 148 extend from the P+ region and the N+ region to a front side of the semiconductor device 100 opposite to the backside metal lines 152. As shown in FIG. 13, the lateral junction diode includes a P+ region 122 and a N+ region 120 formed at a same first level in the substrate 102, and the stacked FET is formed at a second level that is different than the first level. That is, the plane 199 shown in FIG. 13 identifies a boundary in the height direction shown in the cross-sectional view of FIG. 13, where the lateral junction diode is formed above this plane 199 (i.e., embedded in the substrate 102) and the stacked FET is shown below this plane 199.

Figure 14:
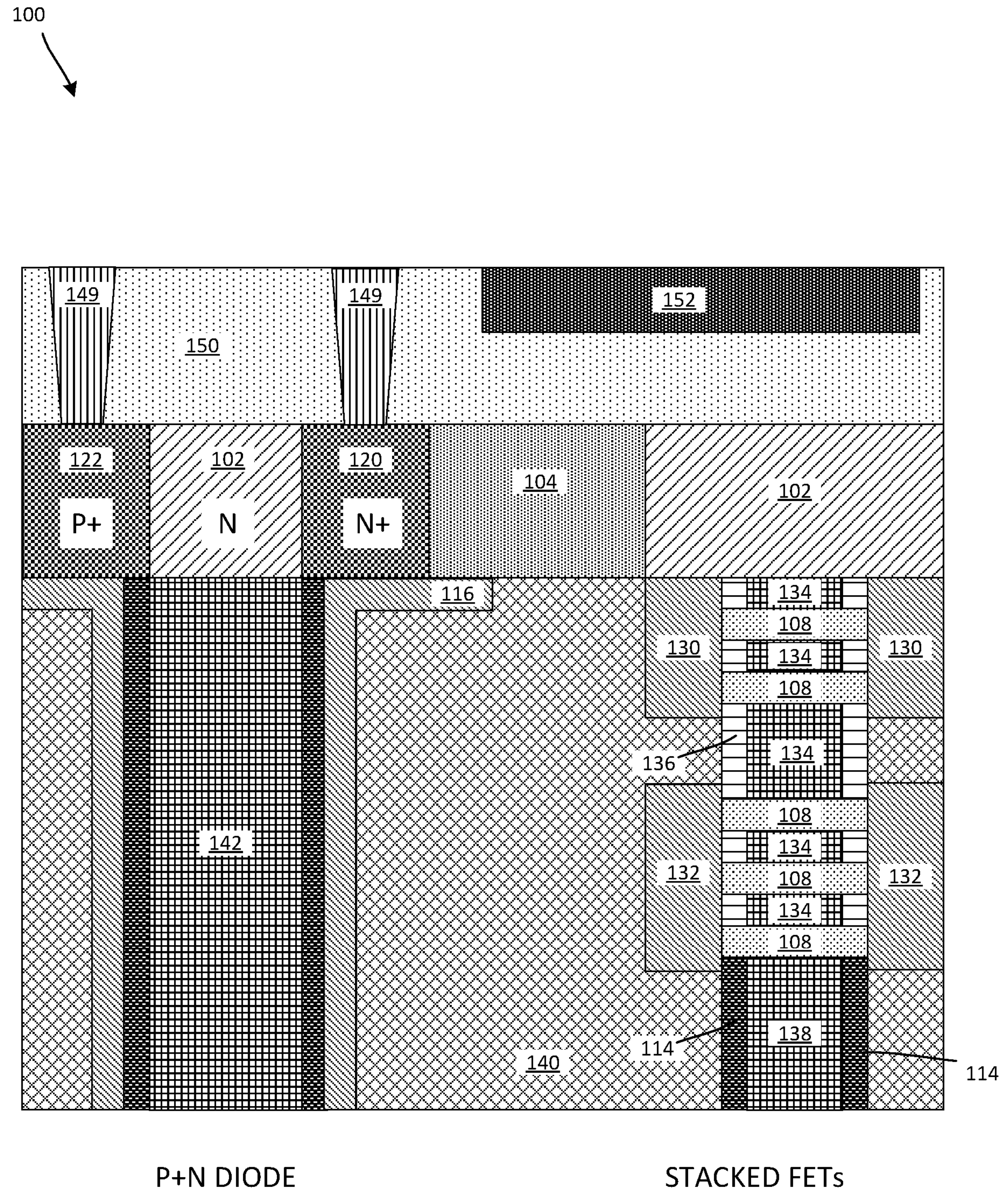
FIG. 14 is a cross-sectional view of a semiconductor device, where the diode contacts are formed on the backside, according to embodiments.

Referring now to FIG. 14, this figure shows an embodiment where the diode contacts 149 are formed through an ILD layer 150 on the opposite side of the N+ region 120 and the P+ region 122. Thus, in these embodiments, the same process described above with respect to FIGS. 1-10 may be used to form the semiconductor device 100. However, unlike the embodiments shown in FIG. 11, where the metallic diode contacts 148 are formed through the ILD layer 140, in the embodiments shown in FIG. 14, the metallic diode contacts 149 are formed through the ILD layer 150 on the opposite side of the semiconductor device 100 relative to what is shown in FIG. 11. Also, one or more backside metal lines 152 of a backside power distribution network (BSPDN) are formed in the ILD layer 150 (note that the metal contact from the backside metal lines 152 to the stacked FETs is not shown in FIG. 14). Thus, the diode contacts 149 are on the same side as the backside metal lines 152 in the ILD layer 150. In other words, the lateral junction diode includes metallic diode contacts in contact with the P+ region and the N+ region, where the metallic diode contacts extend from the P+ region and the N+ region to a back side of the semiconductor device 100 where the backside metal lines 152 are located. As shown in FIG. 14, there is a plane 199 (i.e., interface between different layer levels of the semiconductor device 100). Some elements of the lateral junction diode including the N+ region 120 and the P+ region 122 are above this plane 199 (as viewed in the cross-sectional view of FIG. 14), and the main elements of the stacked FET (e.g., gate electrode 134, semiconductor layer 108, first source/drain epitaxial layer 130 and second source/drain epitaxial layer 132) are below this plane 199.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:

a stacked field effect transistor (FET) formed on a substrate and connected to a backside metal line of a backside power distribution network (BSPDN); and a lateral junction diode co-integrated with the stacked FET, wherein the lateral junction diode includes a P+ region and a N+ region formed at a same first level in the substrate, and the stacked FET is formed at a second level that is different than the first level.

2. The semiconductor device of claim 1, wherein the stacked FET includes a bottom FET including a bottom nanosheet stack in contact with a bottom epitaxial layer, and a top FET including a top nanosheet stack in contact with a top epitaxial layer.

3. The semiconductor device of claim 1, wherein the stacked FET includes a gate electrode.

4. The semiconductor device of claim 3, wherein the lateral junction diode includes an undoped region of the substrate between the P+ region and the N+ region.

5. The semiconductor device of claim 4, further comprising a dummy diode gate in contact with the lateral junction diode at the undoped region of the substrate.

6. The semiconductor device of claim 5, wherein the dummy diode gate is formed at the same second level as the gate electrode of the stacked FET.

7. The semiconductor device according to claim 1, wherein the lateral junction diode includes metallic diode contacts in contact with the P+ region and the N+ region, the metallic diode contacts extending from the P+ region and the N+ region to a front side of the semiconductor device opposite to the backside metal line.

8. The semiconductor device according to claim 1, wherein the lateral junction diode includes metallic diode contacts in contact with the P+ region and the N+ region, the metallic diode contacts extending from the P+ region and the N+ region to a back side of the semiconductor device where backside metal lines are located.

9. The semiconductor device of claim 5, further comprising a gate spacer formed on sidewalls of the dummy diode gate and on sidewalls of the gate electrode.

10. The semiconductor device according to claim 9, further comprising an ion-implantation (I/I) protective liner layer formed on sidewalls of the gate spacer of the lateral junction diode.

11. An electronic device comprising:

a semiconductor device including a stacked field effect transistor (FET) formed on a substrate and connected to a backside metal line of a backside power distribution network (BSPDN); and a lateral junction diode co-integrated with the stacked FET, wherein the lateral junction diode includes a P+ region and a N+ region formed at a same first level in the substrate, and the stacked FET is formed at a second level that is different than the first level.

12. The electronic device of claim 11, wherein the stacked FET includes a bottom FET including a bottom nanosheet stack in contact with a bottom epitaxial layer, and a top FET including a top nanosheet stack in contact with a top epitaxial layer.

13. The electronic device of claim 11, wherein the stacked FET includes a gate electrode.

14. The electronic device of claim 11, wherein the lateral junction diode includes an undoped region of the substrate between the P+ region and the N+ region.

15. The electronic device of claim 14, further comprising a dummy diode gate in contact with the lateral junction diode at the undoped region of the substrate.

16. The electronic device of claim 15, wherein the dummy diode gate is formed at the same second level as a gate electrode of the stacked FET.

17. The electronic device according to claim 11, wherein the lateral junction diode includes metallic diode contacts in contact with the P+ region and the N+ region, the metallic diode contacts extending from the P+ region and the N+ region to a front side of the semiconductor device opposite to the backside metal line.

18. The electronic device according to claim 11, wherein the lateral junction diode includes metallic diode contacts in contact with the P+ region and the N+ region, the metallic diode contacts extending from the P+ region and the N+ region to a back side of the semiconductor device where backside metal lines are located.

* * * * *